(12) United States Patent
Wiklund et al.

(10) Patent No.: US 6,181,190 B1
(45) Date of Patent: Jan. 30, 2001

(54) ELECTRONIC CIRCUIT AND MANUFACTURING METHOD FOR ELECTRONIC CIRCUIT

(75) Inventors: Sven Tor-Björn Wiklund, Upplands-Väsby; Anders Söderbärg, Stockholm, both of (SE)

(73) Assignee: Telefonaktiebolaget LM Ericsson (publ), Stockholm (SE)

( * ) Notice: Under 35 U.S.C. 154(b), the term of this patent shall be extended for 0 days.

(21) Appl. No.: 09/205,606

(22) Filed: Dec. 4, 1998

(30) Foreign Application Priority Data

Dec. 4, 1997 (SE) .................................................. 9704513

(51) Int. Cl.[7] .............................................. H03K 17/687
(52) U.S. Cl. .............................. 327/434; 326/27; 327/101
(58) Field of Search .................................. 326/27, 83, 87; 327/101, 103, 112, 427, 431, 432, 434, 436, 437, 473

(56) References Cited

U.S. PATENT DOCUMENTS

| 4,129,792 | * | 12/1978 | Kawagai | 307/270 |
|---|---|---|---|---|
| 4,719,369 | * | 1/1988 | Asano et al. | 307/443 |
| 5,359,239 | * | 10/1994 | Sato | 307/451 |
| 5,422,588 | * | 6/1995 | Wynne | 327/437 |
| 5,552,744 | | 9/1996 | Burlison et al. | 327/401 |
| 5,589,789 | | 12/1996 | Kamiya | 327/278 |
| 5,594,391 | * | 1/1997 | Yoshizawa | 331/57 |
| 5,652,538 | | 7/1997 | Boudry et al. | 327/403 |

FOREIGN PATENT DOCUMENTS

| 57-32132 | 2/1982 | (JP) | H03K/19/094 |
|---|---|---|---|
| 3-195214 | 8/1991 | (JP) | H03K/23/50 |
| 6-123896 | 5/1994 | (JP) | G02F/1/136 |

OTHER PUBLICATIONS

Millman, Jacob et al., "The Mofest as a Resistance", *Microelectronics*, pp. 154–155, 1987.

* cited by examiner

Primary Examiner—Kenneth B. Wells
Assistant Examiner—Linh Nguyen
(74) Attorney, Agent, or Firm—Burns, Doane, Swecker & Mathis,L.L.P.

(57) ABSTRACT

The conductance may be adjusted of an electronic circuit including a first electronic component having a nominal conductance with a given inaccuracy. The circuit includes at least one additional field effect transistor connected in parallel with the component. The sources of all field effect transistors are connected to a common source, the drains of all field effect transistors are connected to a common drain, and a control unit controls the gate voltage of each field effect transistor individually. The gate voltage is controlled by connecting the gate voltage of each field effect transistor either to a common gate or to the common source. The component may be used to form switches or amplifiers or to control the conductance of circuits including other electronic components serially connected with the electronic circuit.

33 Claims, 8 Drawing Sheets

ELECTRONIC CIRCUIT AND MANUFACTURING METHOD FOR ELECTRONIC CIRCUIT

This application claims priority under 35 U.S.C. §§119 and/or 365 to Swedish Application No. 9704513-2 filed in Sweden on Dec. 4, 1997; the entire content of which is hereby incorporated by reference.

TECHNICAL FIELD

The present invention relates to the design of electronic circuits and in particular to controlling the conductance of electronic components, such as switches or amplifiers.

BACKGROUND

In many electronics implementations mechanical relays are used. There has long been a desire to replace the mechanical relays with solid state circuits or switches, that may be integrated in silicon components. Such circuits have a number of advantages compared to the conventional mechanical relays:

- they normally take up less space on the circuit board
- they enable a higher degree of integration and thereby also a higher degree of flexibility.
- they are normally able to switch from off-state to on-state and vice versa much faster than mechanical relays.

A major drawback with designing electronic system using solid state switches is that their resistance in the on state, or on-resistance, is relatively high compared to mechanical relays. Further, for several applications, the resistance in the on-state has to have an exact value, which can be hard to reach using a solid state switch solution.

In some applications two switches are used together, for example, to connect or disconnect the signal loop between a subscriber and a line circuit in a telephone network. In this case it is important to match the switches to substantially the same resistance, as differences in on-resistance between them will result in deterioration of the longitudinal balance for the signal loop, making the network more sensitive to common mode noise. To keep the longitudinal balance for the signal loop at an acceptable level, the difference in resistance between the two switches should be kept below 1Ω. A number of switches may be used together in a line circuit, for example, for testing purposes. These switches should also be matched to each other as perfectly as possible. The switches inside the signal loop must also work bidirectionally, that is, they must be able to conduct current in both direction and handle both negative and positive high voltages.

The use of two mirrored transistors, for example, in differential amplifiers or line drivers, also requires exact tuning of the mirrored transistors, to minimize the error introduced in the differential signal by the amplifier or driver itself. It is then important that the output characteristics of the transistors are well tuned both in the linear region (where channel-conductance and on-resistance are defined) and in the saturation region (where the trans-conductance is defined).

Further, because of the requirements on high linearity, even for low voltage drops across the switch is low, it is feasible to use field effect transistors (FETs) rather than bipolar solutions to implement the switch. The linearity is needed to mask out signal distortion.

Field Effect Transistors are unipolar, multielectrode semiconductors, comprising four regions, commonly referred to as ground, source, drain and body. Normally, the body region is connected together with the source region. Current may flow in conducting channels between the source and the drain, and is modulated by an electric field applied at the gate. Application of a suitable bias across the transistor causes charge carriers to flow from the source to the drain of the transistor, that is, the current is controlled by the difference between the gate voltage and the source/drain voltage.

The inaccuracy of a single transistor is determined by variations in the manufacturing process and in the properties of the material used. The inaccuracy of the conductance of a transistor is approximately 10%. The difference in on-resistance between two switches used in a pair should be kept below 1Ω. Normally, therefore, transistors with an on-resistance up to 10Ω are used in such applications.

To reduce the inaccuracy in the on-resistance of a switch, the absolute value of the on-resistance is kept low. For example when used to connect and break the signal loop in a telephone network, an on-resistance lower than 20Ω, or even 10Ω is required to fulfil the requirements of a mismatch lower than 1Ω. Also, the performance at high voltages must be very good, typically for breakdown voltages higher than 300V for the switch. The requirements on on-resistance and high breakdown voltage together makes a switch based on FETs quite spacious.

A common transistor switch for analogue applications may also comprise two field effect transistors of opposite channel type, connected in parallel. The respective drains and sources of the two transistors are tied together to become the switch terminal, while the gates of the transistors are used to control the on/off action. Essentially, the n channel transistor is on for positive gate-to-source voltages and off for negative gate-to-source voltages (vice versa for the p channel transistor). The on characteristic for such a transistor switch is then sensitive to variations in the conductance of both the n and the p channel transistor.

To fulfil the above requirements on good linearity, high breakdown voltage, and low mismatch of the on-resistance of the switches, and also achieve a low mismatch of the conductance of transistors, currently the devices are overdimensioned, to keep the total on-resistance lower than what is really necessary.

SUMMARY OF THE INVENTION

It is an object of the present invention to achieve an electronic component the conductance of which is adjustable with a high accuracy, especially a high-voltage component having a breakdown voltage of approximately 300V or higher.

It is an object of the present invention to achieve a switch that can be tuned very exactly to a desired conductance.

It is another object of the invention to enable the tuning of two transistor based switches, or two transmission lines comprising such switches, to practically the same conductance.

It is yet another object of the invention to achieve transistor based switches that are smaller than the ones made using prior known design technique.

It is still another object of the invention to achieve transistor based switches that fulfil high requirements on linearity.

It is another object of the invention to achieve a well balanced differential amplifier.

These objects are achieved according to the invention, by an electronic circuit comprising a first electronic component having a nominal conductance with a given inaccuracy, said circuit comprising at least one additional field effect transistor connected in parallel with the component, and means for adjusting the conductance of the electronic circuit.

According to a preferred embodiment, the first electronic component is a field effect transistor or a resistor, or a transistor-based component. According to a preferred embodiment, the additional field effect transistors are of the same kind as the first field effect transistor. To achieve a bi-directional circuit, the additional field effect transistors may be alternatingly n-type and p-type field effect transistors.

Preferably, the sources of all field effect transistor are connected to a common source, the drains of all field effect transistor are connected to a common drain and a control unit controls the gate voltage of each field effect transistor individually.

The nominal conductance of the first additional field effect transistor should be selected so that it is substantially equal to the inaccuracy of the conductance of the electronic component.

For each following additional field effect transistor the nominal conductance is substantially reduced by half;

The control unit connects the gate of each field effect transistor may be voltage controlled or controlled by connecting it either to a common gate or to the common source.

The transistor assembly may be serially connected with at least one external component, to adjust the conductance of this component.

An electronic switch is also disclosed, comprising a first and a second electronic component each having a nominal conductance with a specific inaccuracy, the sources of the two electronic components being interconnected, said first electronic component having at least one additional field effect transistor connected parallel to said first electronic component, said second electronic component having at least one additional field effect transistor connected parallel to said second electronic component, control means being provided for adjusting the conductance of each additional field effect transistor.

Another electronic switch is disclosed comprising a first and a second electronic component each having a nominal conductance with a specific inaccuracy the sources of the two electronic components being connected to a common source, the drains being connected to a common drain, the first electronic component being an n-channel field effect transistor and the second electronic component being an p-channel field effect transistor, said first electronic component have at least one additional field effect transistor of same type connected parallel to said first electronic component, said second electronic component have at least one additional field effect transistor of same type connected parallel to said second electronic component, the conductance of each additional field effect transistor is adjustable to minimize the inaccuracy of the conductance for the electronic switch.

A method of manufacturing and adjusting said electronic circuit and electronic switches is disclosed, comprising the steps of providing a first electronic component, providing at least one additional transistor, each additional transistor having a specified nominal conductance, and controlling the conductance of said electronic circuit by means of an electronic adjusting means.

The invention offers the following advantages:

It minimizes the common mode noise when transistor based switches are used in pairs.

It allows the tuning of the conductance of any kind of electronic component.

It allows the size of the transistor based switches to be reduced. The size is inversely proportional to the on-resistance of the transistor. The method according to the invention enables the use of transistors having an on-resistance of 20Ω or even 30Ω as the main transistor in the switch, which will be half the size or one third of the size, respectively, of a transistor having an on-resistance of 10Ω. As the other transistors used will have significantly higher resistance, they can be made significantly smaller. Thus the size of the whole switch may effectively be reduced.

It enables the matching of two switches after the manufacturing process.

It enables the matching of the entire transmission lines, that is, the switches and any other circuitry used in connection with the switches, after the manufacturing process.

DETAILED DESCRIPTION OF EMBODIMENTS

Figure 1A:
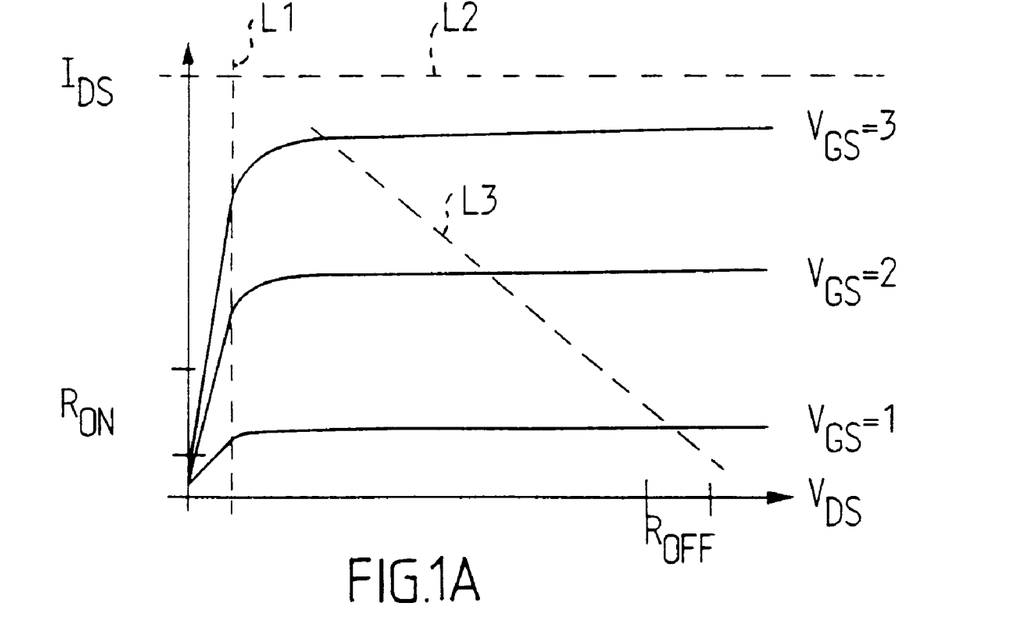
FIG. 1A is a graph showing typical output characteristics for a FET.

FIG. 1A is a graph showing typical output characteristics for a FET. Three curves show the output when three different gate voltages $V_{GS1}$, $V_{GS2}$ and $V_{GS3}$, respectively, are applied. The current $I_{DS}$ and the voltage $V_{DS}$ between the drain and the source of a FET are shown along the vertical and the horizontal axis, respectively. The region to the left of a vertical dotted line is the linear region of the transistor, in which the current $I_{DS}$ increases in a substantially linear way with increasing $V_{DS}$. The region to the right of the vertical dotted line is the saturation region, in which the current $I_{DS}$ is substantially constant for a constant gate voltage $V_{GS}$.

When the transistor is used as switch, the on state, is in the linear region, that is, to the left of the vertical dotted line, in other words, for low values of $V_{DS}$. The region used for the on state is indicated as $R_{on}$ on the vertical axis. This serves both to keep the forward voltage drop $V_{DS}$ as low as possible and to achieve linear transistor characteristics with respect to the current $I_{DS}$ and the voltage $V_{DS}$. In the linear region, for a constant $V_{GS}$, the channel conductance $G_D$ is defined as $G_D = dI_{DS}/dV_{DS}$.

If the transistor is sufficiently linear $G_D$ may be taken to be $1/R_{ON}$, $R_{ON}$ being the on-resistance.

A dashed line indicates a typical resistive load line for when the transistor is used as an amplifier. When used as an amplifier, the transistor operates in the saturation region of the graph shown in FIG. 1A. In this region, the current $I_{DS}$ between the drain and the source is controlled by the gate voltage $V_{GS}$. The characteristics of the transistor is then primarily determined by its transconductance $G_M$, that is, for a constant $V_{DS}$, $G_M = dI_{DS}/dV_{GS}$.

Figure 1B:
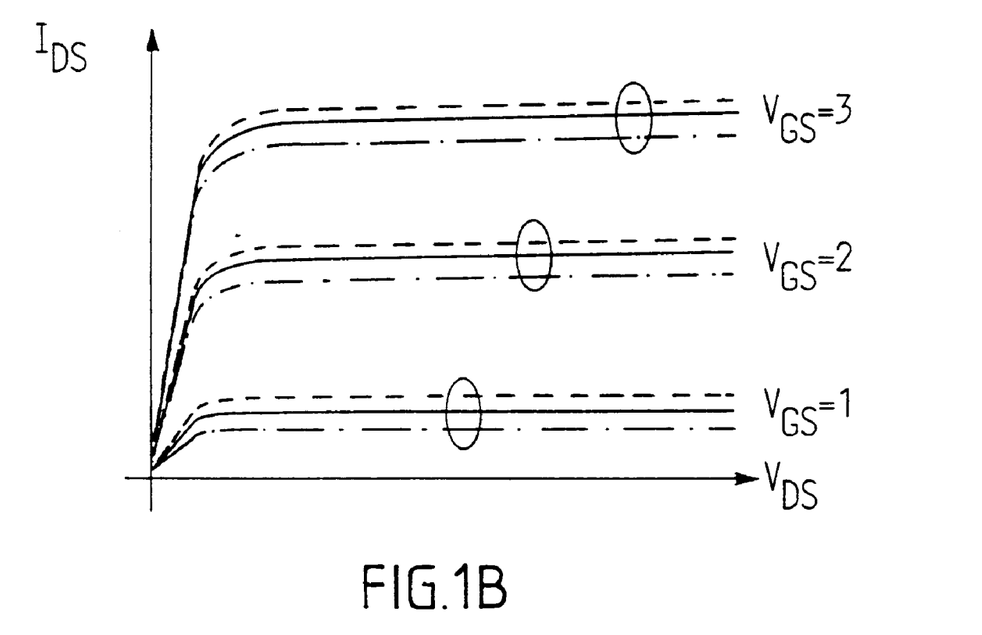
FIG. 1B is a graph showing the deviation in output characteristics because of inaccuracies in the FET's conductance.

FIG. 1B is a graph showing typical output characteristics for a FET with the same gate voltages $V_{GS1}$, $V_{GS2}$ and $V_{GS3}$, respectively as in FIG. 1A. The current $I_{DS}$ and the voltage $V_{DS}$ from the drain to the source of a FET are shown along the vertical and the horizontal axis, respectively. Three different curves for each $V_{GS}$: the middle, solid line indicates the situation when the conductance corresponds to the nominal conductance, that is, G=Gnom. The lower, dashed line and the upper, dotted line show the deviation that may be caused by the inaccuracy of the conductance, that is, G=Gnom−ΔG and Gnom+ΔG, respectively.

The present invention will enable a finer tuning of both the channel conductance $G_D$ and the transconductance $G_M$ of the component than prior art techniques. Therefore, references in this document to the conductance G of the transistor, or the switch, should be taken to include both the channel conductance $G_D$, the transconductance $G_M$ and also the on-resistance $R_{ON}$.

Figure 2A:
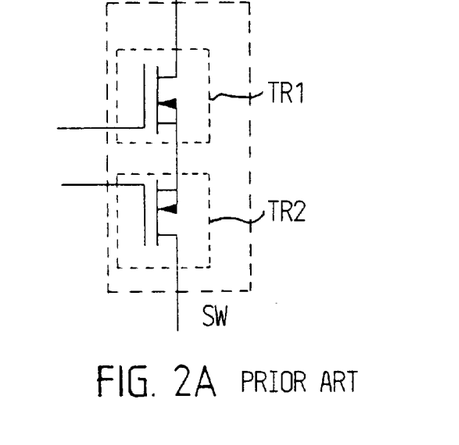
FIG. 2A shows a prior art bidirectional switch.

FIG. 2A shows a prior art bidirectional switch obtained by serially connecting two FETs TR1, TR2, each comprising a source S1, S2, a drain D1, D2 and a gate G1, G2. The sources S1, S2 of the first TR1 and the second TR2 transistors have been connected so that the transistors TR1, TR2 mirror each other, to enable the switch to function bidirectionally, that is, regardless of the direction of the voltage across the switch.

Figure 2B:
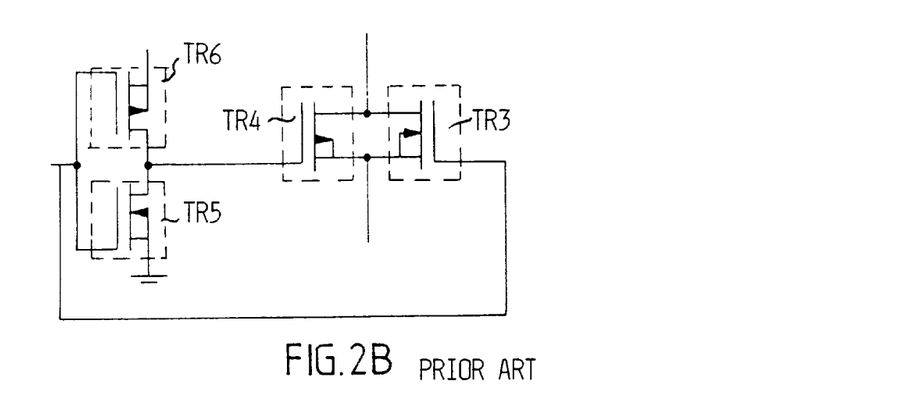
FIG. 2B shows another example of a prior art bidirectional switch.

FIG. 2B shows another example of a prior art bidirectional switch comprising a first TR3, TR4 and a second pair TR5, TR6 of transistors each comprising one n type and one p type transistor. The sources and the drains, respectively, of the first transistor pair TR3, TR4 are interconnected to form a common source and a common drain. In the second transistor pair TR5, TR6, the gates and the drains, respectively, are interconnected. The gate of one transistor TR3 in the first pair is connected to the common gate of the second pair TR5, TR6. The gate of the other transistor TR4 of the first pair is connected to the common drain of the second pair TR5, TR6.

Figure 2C:
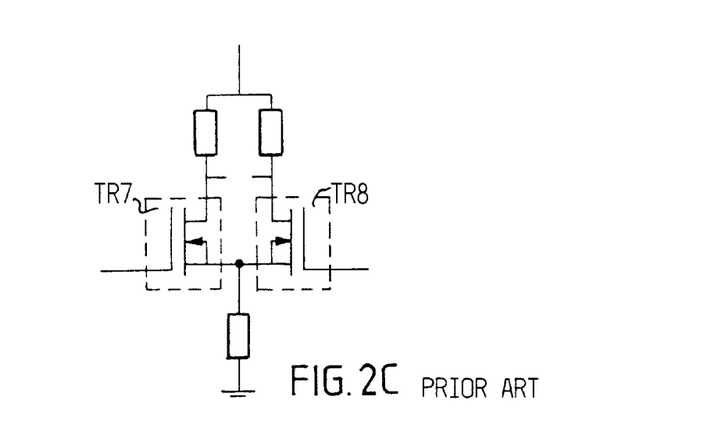
FIG. 2C shows a prior art differential amplifier.

FIG. 2C shows a prior art differential amplifier comprising two transistors TR7, TR8. The sources of the two transistors are interconnected and connected to ground through a resistor. The gate voltages of the transistors form the input to the amplifier, and voltage between the drains forms the output of the amplifier. A number of different embodiments of this basic structure are known. In all of them it is important that the conductances of the two transistors are substantially equal.

Figure 3:
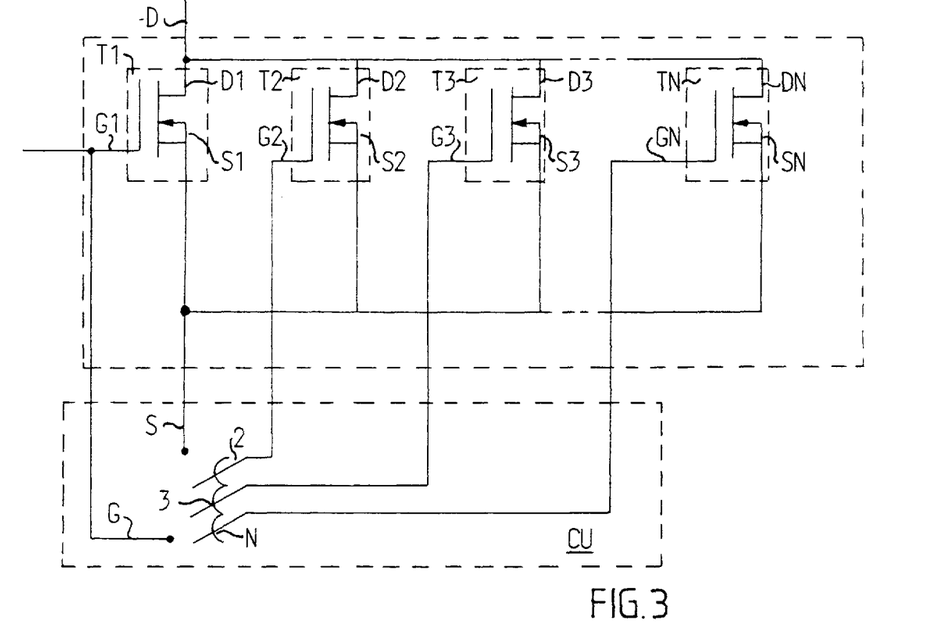
FIG. 3 shows a transistor assembly, in itself constituting a transistor, according to one embodiment of the invention.

FIG. 3 shows an assembly T of transistors T1, T2, ..., TN connected in such a way that they can be trimmed to a specific conductance with a very low inaccuracy. The package T comprises a first transistor T1, which is always connected, and a number of smaller transistors T2, T3, ..., TN, each of which is individually connectable in parallel with the first transistors T1.

The sources S1, S2, S3, ..., SN of all transistors T1, T2, T3, ..., TN are connected to a common source S. The drains D1, D2, D3, ..., DN are connected to a common drain D.

The gates G2, G3, ... GN of the transistors that are to be connected will be connected to the gate G of the first transistor T1, thus this gate also constitutes the gate of the transistor assembly T; the ones that are not to be connected will be connected to the common source contact S.

This is shown in the FIG. 3 as a control unit CU in which the gates, G2, G3, ... GN of each of the transistors T2, T3, ..., TN is connectable either to the common gate G or to the common source contact S, schematically shown in the figure as switches 2, 3, ..., N. Obviously, instead of providing the connection means, the switches could be implemented individually for each transistor.

The switches 2, 3, ..., N may be implemented in a number of different ways. One relatively simple solution is to use two low voltage FETs for each switch, one connecting the gate G2, G3, ..., GN to the common gate G and one connecting the gate G2, G3, ..., GN to the common source. The low voltage FETs must then be controlled so that only one of them is closed at any given time. As the voltage across these low voltage FETs will never exceed the maximum voltage between the gate and the source of the inventive switches, and they will always be used to apply a voltage to the gate of the inventive switches, they may be made very small compared to the high voltage FETs used in the switches according to the invention. The on- or off-status of the switches 2, 3, ..., N, may then be software controlled directly from a CPU, EEPROM or a similar kind of unit.

Alternatively, the switches 2, 3, ..., N could consist of fuses or anti-fuses which in a procedure of trimming of the conductance value are chosen to be shorted or broken.

Thus the transistor assembly will function as a single transistor and can be used in any transistor application. It is, however, particularly useful for applications requiring a very exact conductance, such as differential amplifiers or line drivers. In FIG. 3, n type Field Effect Transistors are used. As will be readily understood, p type Field Effect Transistors could also be used. Further, the FETs might be, for example, Metal Oxide Semiconductor Field Effect Transistors (MOSFET), Junction Field Effect Transistors (JFET), Metal Semiconductor Field Effect Transistors (MESFET), lateral or vertical Double Diffused MOSFET) or similar components.

Figure 4:
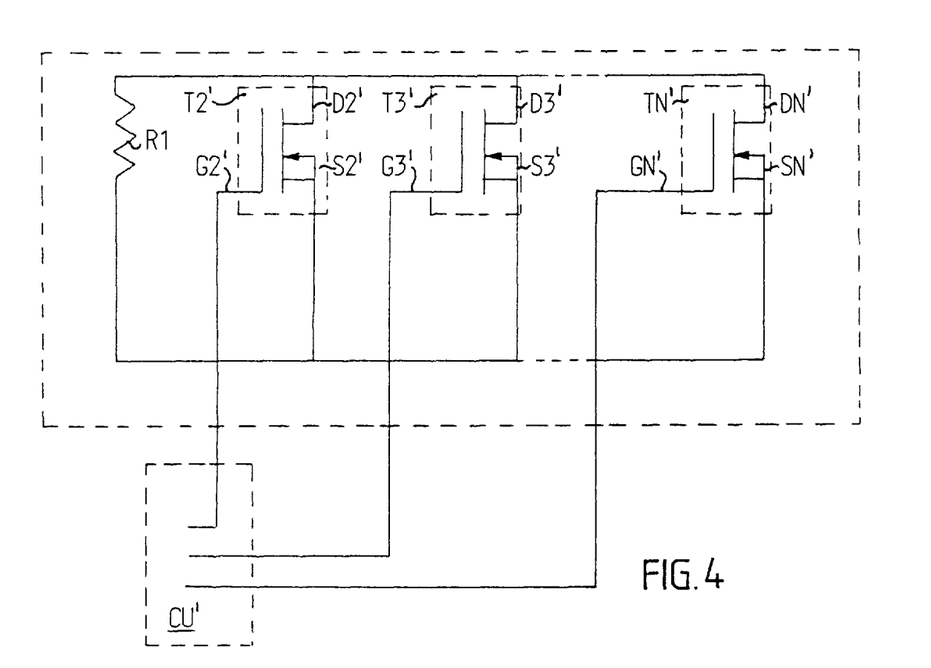
FIG. 4 shows an assembly of a resistance and a number of transistors, according to another embodiment of the invention.

FIG. 4 shows a similar assembly to the one shown in FIG. 3, but instead of the main transistor T1 in FIG. 3, a resistor R1 is used.

A number of transistors T2', T3', ..., TN' having gates G2', G3', ..., GN, sources S2', S3', ..., SN' and drains D2', D3', ..., DN', are connected in the same manner as in FIG. 3, with the sources S2', S3', ..., SN' connected to a common source S', and to a first leg of the resistor, the drains D2', D3', ..., DN' connected to a common drain D' and to a second leg of the resistor. The gates G2', G3', ..., GN are connectable, in a control unit CU', by switches 2', 3' and N', respectively, to one of the common gate G' and the common source S'.

In the following it will be shown how the relative error of the conductance of the transistor may be reduced according to one embodiment of the invention, shown in FIG. 3, if the whole package T is seen as one transistor, having a conductance of G. First assume that the requirement is that the error in conductance G be kept below ±ΔGmax.

The conductance of the first transistor T1 is determined by $$G1 = G1nom \pm \Delta G1 \qquad (1)$$

where ΔG1<ΔGmax. G1nom is the nominal conductance of the transistor T1.

Hence the conductance G1 varies from G1nom−ΔG1max to G1nom+ΔG1max The desired conductance of the transistor assembly is $G_F$=G1nom+ΔG1max.

The conductance of transistor T2 has the relative inaccuracy $$\epsilon_2 = \Delta G2max/G2nom \qquad (2)$$

the transistor T2 is chosen so that $$G2nom = \Delta G1max\,(1-\epsilon_2) \qquad (3)$$

If, in calibration measurements, it is found that the actual conductance of transistor T1 meets the requirement:

$$G1 < G_F - \Delta G1max, \qquad (4)$$

then the transistor T2 is connected.

This gives the lower and upper limits for the conductance of the transistor package from $G_F - \Delta G1max\,(1+2\epsilon_2)$ to $G_F$.

The range of variation is $\Delta G1max\,(1+2\epsilon_2)$.

The conductance of transistor T3 has the relative inaccuracy $$\epsilon_3 = \Delta G3max/G3nom \qquad (5)$$

the transistor T3 is chosen so that $$G3nom = \Delta G1max\,(1+2\epsilon_2)(1-\epsilon_3)/2 \qquad (6)$$

If, in calibration measurements, it is found that the actual conductance of the transistor package consisting of transistor T1 and T2 is, $$G1 < G_F - \Delta G1max\,(1+2\epsilon_2)/2 \qquad (7)$$

then the transistor T3 is connected.

The range of variation is $\Delta G1max\,(1+2\epsilon_2)(1+2\epsilon_3)/2$

The conductance of transistor T4 has the relative inaccuracy $$\epsilon_4 = \Delta G4max/G4nom \qquad (8)$$

The transistor T4 is chosen so that $$G4nom = \Delta G1max\,(1+2\epsilon_2)(1+2\epsilon_3)(1-\epsilon_4)/4 \qquad (9)$$

If, in calibration measurements, it is found that the actual conductance of the transistor package consisting of transistor T1, T2 and T3 is $$G1 < G_F - \Delta G1max\,(1+2\epsilon_2)(1+2\epsilon_3)/4 \qquad (10)$$

then the transistor T4 is connected.

The range of variation is $\Delta G1max\,(1+2\epsilon_2)(1+2\epsilon_3)(1+2\epsilon_4)/4$ For a number of additional transistors n the range of variation becomes $$\Delta G1max\,(1+2\epsilon_2)(1+2\epsilon_3)\ldots(1+2\epsilon_a)/2^{(n-2)} \qquad (11)$$

when $\epsilon_i < 0.5$ the range decreases with each additional transistor in the package.

This means that, if the relative error is less than 0.5, in theory the inaccuracy of G may be made arbitrarily small (reduced by $(1+2\epsilon_i)/2$ for each extra transistor step). There are, of course, practical limitations, such as the minimum acceptable size of the smallest transistors and that the relative error is higher for very small components.

Figure 5A:
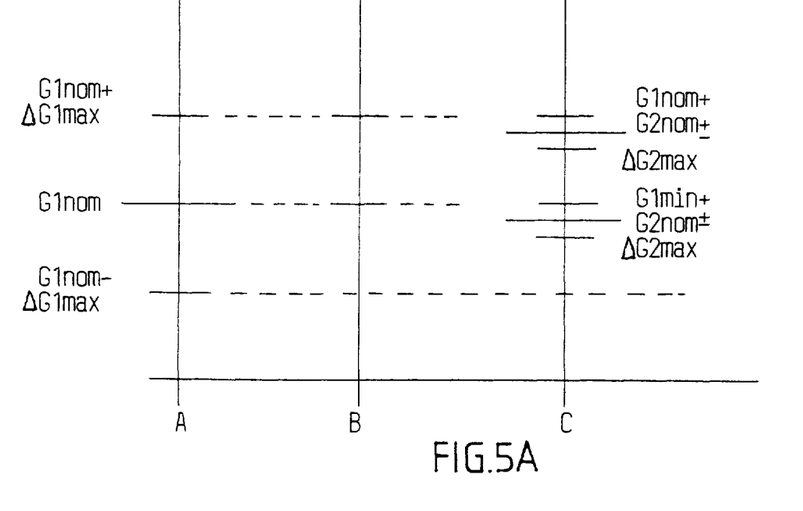
FIG. 5A shows the principle of adjusting the conductance of the transistor assembly according to a first embodiment of the invention.

FIG. 5A is a schematic representation of the reasoning discussed in connection with equations (1)–(11).

On the first vertical axis A, the nominal conductance G1nom of the main transistor T1 is shown, with its maximum deviations G1nom+G1max above G1nom and G1nom−ΔG1max the same distance below G1nom.

On the second vertical axis B, the actual conductance of the main transistor T1 has been found in calibration measurements to be above G1nom. It is therefore known that this conductance lies within the limits G1nom and G1nom+ΔG1max as shown on the second vertical axis B. Therefore, the first additional transistor T2 is not connected.

On the third vertical axis 3, the two extreme situations in which the first additional transistor T2 will be connected are shown: In the first situation, the actual conductance of the first transistor is the lowest possible conductance, G1min=G1−ΔG1max. The first additional transistor is therefore connected, to produce the total conductance G1min+G2nom, with the inaccuracy ±ΔG2max.

In the second situation, the actual conductance of the first transistor is equal to G1nom. Connecting the first additional transistor therefore produces the total conductance G1nom+G2nom with the inaccuracy ±ΔG2max. Thus, the maximum possible conductance of the assembly in this case is:

$$G1nom + G2nom + \Delta G2max = G1nom + \Delta G1max, \qquad (12)$$

which is the desired conductance of the assembly.

Figure 5B:
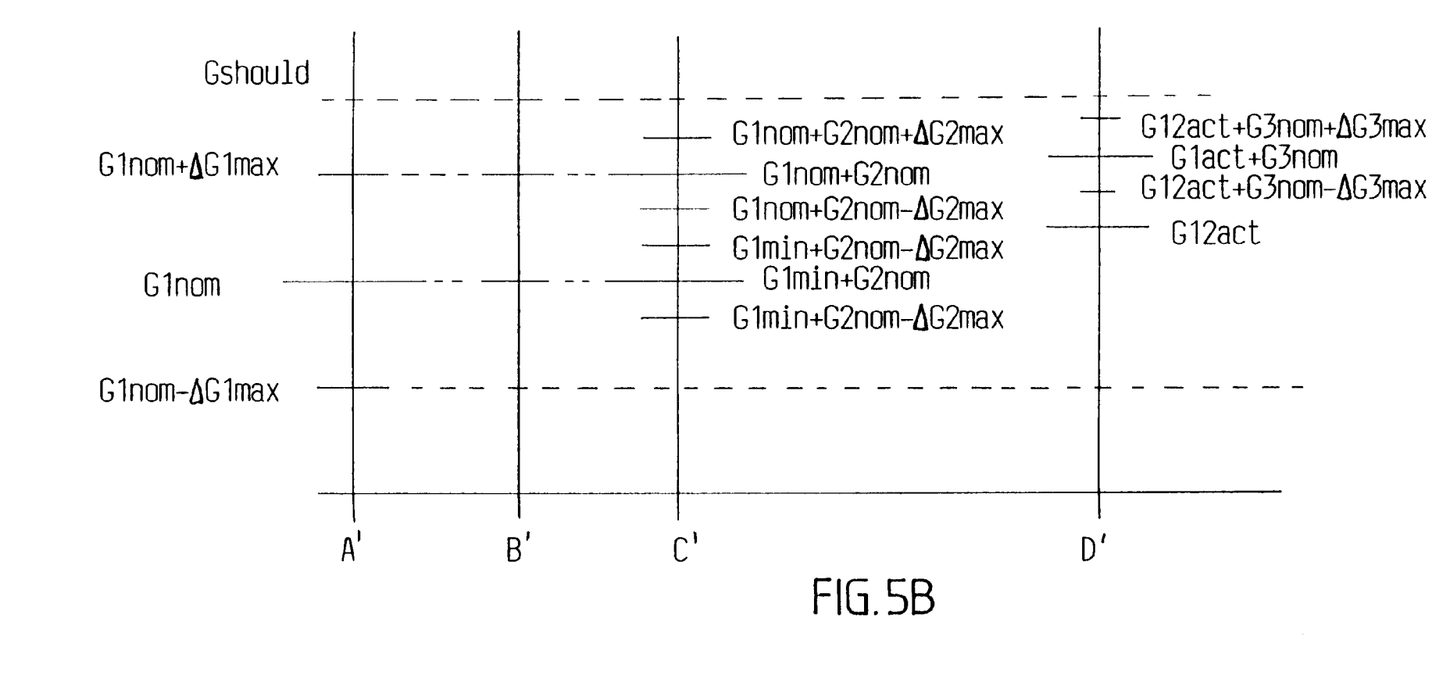
FIG. 5B shows the principle of adjusting the conductance of the transistor assembly according to a second embodiment of the invention.

FIG. 5B is a schematic representation of the tuning of the transistor assembly according to another embodiment of the invention. Here, the desired conductance Gshould, shown by a dashed line, to which the assembly should converge is selected higher than G1+ΔG1max. For example, ΔG1max can be selected to take into account the inaccuracy of one or more other components connected serially with the transistor assembly.

The selection criteria for which additional transistors to connect are then slightly different from the ones discussed in the equations (1)–(11) and in connection with FIG. 5A.

On the first vertical axis A, the nominal conductance G1nom of the main transistor T1 is shown, with its maximum deviations G1nom+ΔG1max above G1nom and G1nom−ΔG1max the same distance below G1nom.

On the second vertical axis B, the actual conductance of the main transistor T1 has been found in calibration measurements to be above G1nom. It is therefore known that this conductance lies within the limits G1nom and G1nom+ΔG1max as shown on the second vertical axis B. Therefore, the first additional transistor T2 is not connected.

On the third vertical axis 3, the two extreme situations in which first additional transistor will be connected are shown: In the first situation, the actual conductance of the first transistor is the lowest possible conductance, G1min=G1−ΔG1max. The first additional transistor is therefore connected, to produce the total conductance G1min+G2nom, with the inaccuracy ±ΔG2max. In the second situation, the actual conductance of the first transistor is equal to G1nom. Connecting the first additional transistor therefore produces the total conductance G1nom+G2nom with the inaccuracy ±ΔG2max.

On the fourth vertical axis D, the actual conductance G12act of the main transistor T1 and the first additional transistor T2 together has been measured. As this conductance is lower than the conductance G1nom+G2nom/2, the second additional transistor T3 is connected, to produce the conductance G12act+G3nom±ΔG3max.

These steps are repeated for each of the additional transistors.

It will be clear from the above discussions that the relative conductance of the transistors can be selected in a number of different ways. The criteria for deciding which transistors to connect will vary depending on this relative conductance and on the desired total conductance of the transistor assembly compared to the main transistor.

For example, even if the desired conductance is G1+ΔG1max the nominal conductance of the first additional transistor could be equal to ΔG1max. The first additional transistor would then only be connected if the actual conductance of the main transistor was less than G1nom−ΔG2max.

Figure 6:
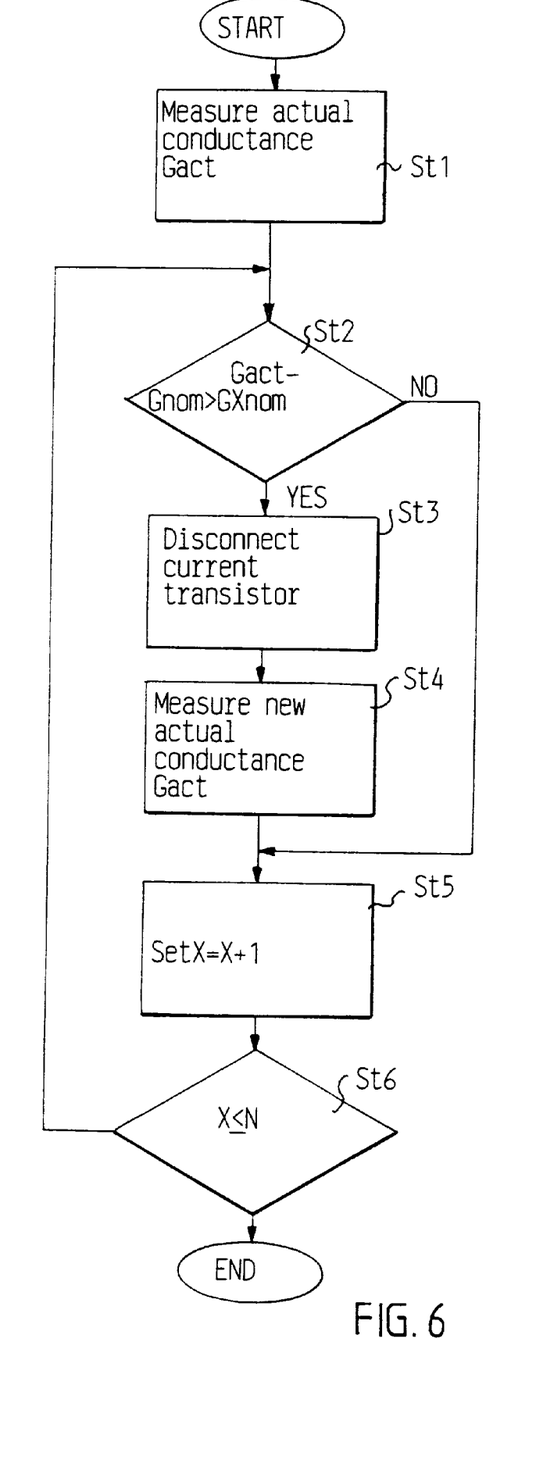
FIG. 6 is a flow chart of the procedure for adjusting the conductance of the transistor assembly according to another embodiment of the invention.

In practice, it is equally feasible to start with all transistors connected and to determine, for each of the additional transistors T2, T3, . . . TN which ones to disconnect. This procedure is shown in FIG. 6.

As in the previous embodiment, the main transistor T1 is always connected. The additional transistors are then connected or disconnected in sequence, starting with the largest one, T2. In the flow chart, the number of each transistor has been replaced by an X. The initial value of X is 2, so that first, the nominal conductance G2nom of the first additional transistor T2 is considered, then X is incremented and the nominal conductance G3nom of the second additional transistor T3 is considered, etc., until all N additional transistors have been considered, that is X=N.

Step St1: The actual conductance Gact of the whole assembly is measured and compared to the desired conductance Gnom.

Step St2: Is $$Gact-Gnom>GXnom \quad (13)$$

If yes, go to step S3, if no, go to step S5.

Step St3: Disconnect the transistor TX currently being considered.

Step St4: Measure the new actual conductance Gact with TX disconnected.

Step St5: Set X=X+1
that is, consider the next additional transistor.

Step St6: Are there more additional transistors, that is X≦N?
If yes, go to step S2, If no, end of procedure.
then the second additional transistor T3 is disconnected. This step is repeated for each of the remaining additional transistors. The resulting actual conductance G will be:

$$G=Gnom \pm \Delta Nmax, \quad (14)$$

ΔGNmax being the substantially equal to the inaccuracy of the smallest additional transistor TN.

Figure 7:
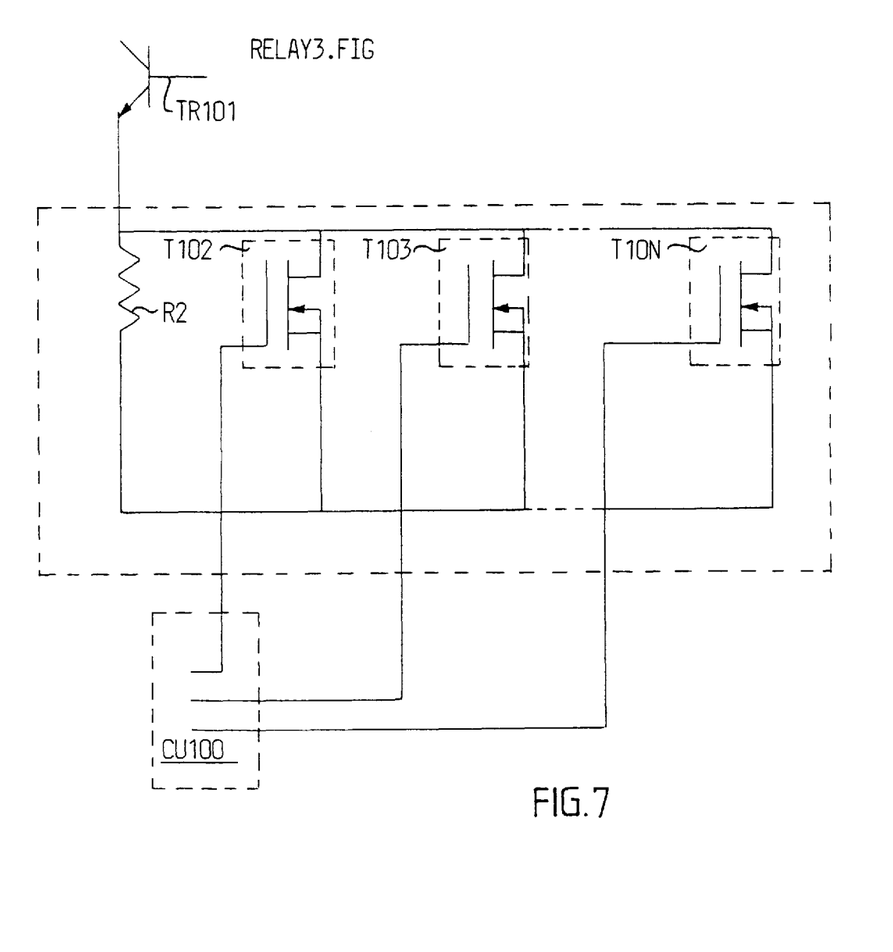
FIG. 7 shows an amplifier according to the invention.

FIG. 7 shows an amplifier circuit according to another embodiment of the invention, for adjusting the conductance of a connection, according to an embodiment of the invention. A transistor TR101 is used, and a transistor assembly like the one shown in FIG. 4 is connected serially with the transistor TR101 to enable the adjustment of the conductance. The transistor assembly comprises a first resistor R2 and a number of transistors T102, T103, . . . , T10N, each of which is individually connectable in parallel with the resistor R2 to adjust the conductance of the assembly. The connection of the transistors is performed in a control unit CU100.

In this configuration, the relative conductance of the additional transistors can be selected in dependence of the total inaccuracy of the transistor TR101 and the main component of the transistor assembly, which is in this case a resistor R2.

Instead of the transistor assembly shown, a transistor assembly similar to the one in FIG. 3 might be used.

Figure 8:
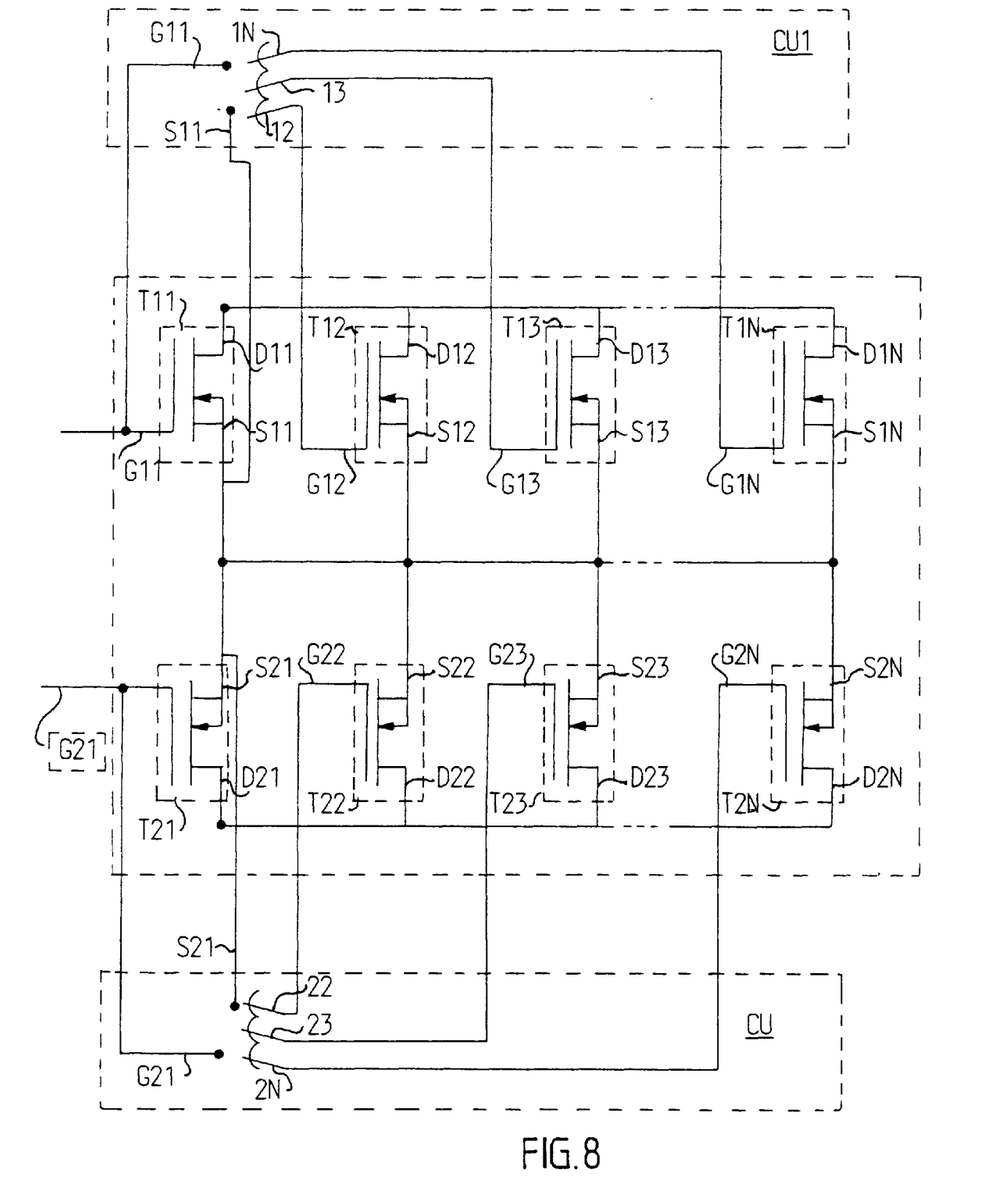
FIG. 8 shows a bidirectional switch according to an embodiment of the invention.

FIG. 8 shows a bidirectional switch according to a first embodiment of the invention. The switch is, in principle, similar to the one shown in FIG. 2A, but, in the place of each of the transistors TR1, TR2 in FIG. 2A, having a transistor package like the one T of FIG. 3.

The first, or main, transistor T11, T21 of each transistor package TR1', TR2', respectively, is always used in the transistor package. Each of the main transistors T11, T21 has a number of additional transistors T12, T13, . . . T1N and T22, T23, . . . , T2N, respectively, connectable in parallel with the main transistor T11, T21.

The sources S11, S12, S13, . . . , S1N and S21, S22, S23, . . . , S2N of all transistors T11, T12, T13, . . . , T1N and T21, T22, T23, . . . , T2N have been connected to form a common source S12. The drains of each main transistor and all additional transistors connectable with this transistor have been connected, that is, the drains of transistors T11, T12, T13, . . . , T1N are interconnected and the drains of transistors T21, T22, T23, . . . , T2N are interconnected.

The gate of each of the additional transistors T12, T13, . . . , T1N is connectable, by means of switches 12, 13, . . . , 1N in a connection means CU1 to the gate G1 and to the common source S12, respectively. The gate of each of the smaller transistors T22, T23, . . . , T2N is connectable by means of switches 22, 23, . . . , 2N in a connection means CU2 to the gate G2 and to the common source S12, respectively. The connection means CU1 and CU2 may be implemented as one means, but are shown in FIG. 8 as two separate means for clarity only. Obviously, instead of providing the connection means, the switches could be implemented individually for each transistor.

To determine which ones of the smaller transistors to should be connected to participate in the switch, the method discussed in connection with FIG. 3 and equations (1)–(11) is used. The connection methods are also discusses in connection with FIGS. 5 and 6.

The preferred conductance of the smaller transistors, relative to the main transistor depends on the relative error in each transistor. The first T12 of the smaller transistors should have the same nominal conductance as the inaccuracy of the main transistor T11. If, for example, the inaccuracy in the conductance of the main transistor T11 is 10%, then the nominal conductance of the first smaller transistor T12 should be one tenth the nominal conductance of the main transistor. The nominal conductance of the second smaller transistor T13 should be approximately equal to half the conductance of the first smaller transistor. More specifically, the nominal conductance should be half the conductance of the first smaller transistor plus the inaccuracy of the first smaller transistor.

As the physical size of the transistor is approximately proportional to its conductance, the size of each transistor will be reduced by approximately the same factor compared to the previous one.

Figure 9:
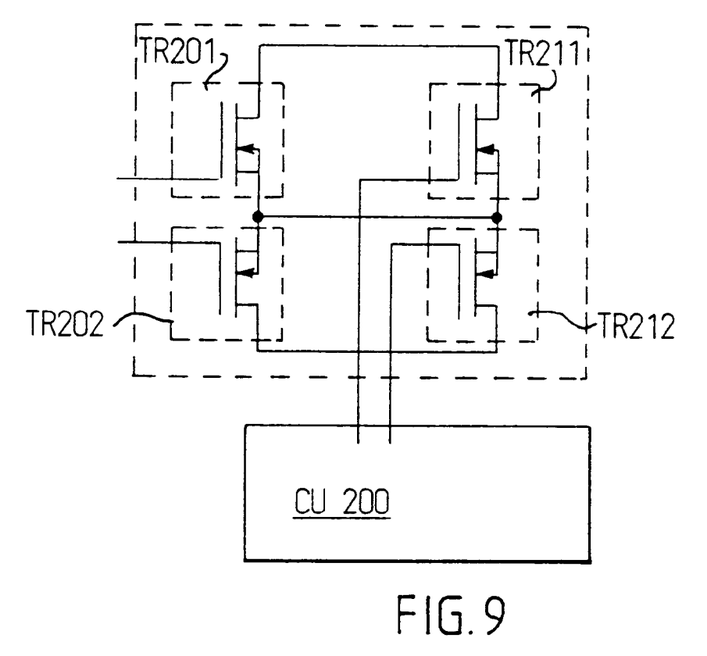
FIG. 9 shows a bidirectional switch according to another embodiment of the invention.

FIG. 9 shows a switch according to a second embodiment of the invention. As before, a bidirectional switch comprises a first TR201 and a second TR202 main transistor, the sources of which are interconnected. For each of the main transistors TR201, TR202, there is one additional transistor TR211, TR212. The sources of all four transistors TR201, TR202, TR211, TR212 are connected to form a common source. The drains of the first main transistor TR201 and the first additional transistor 211 are interconnected, and the drains of the second main transistor TR202 and the second additional transistor TR212 are interconnected. The switch also comprises control means CU200 for controlling the gate voltage of the additional transistors TR211 and TR212. By controlling the gate voltage of the additional transistors TR211 and TR212, the conductance of the each main transistor TR201, TR202 can be controlled.

The adjustable switch according to the invention will be especially useful in applications in which two switches are used, that should be tuned to each other as accurately as possible. One such application, as explained above, is a differential amplifier. Another important application is a subscriber line in a telecommunications network. Here, preferably the conductance of the whole line is considered, not just the conductance of the switches themselves.

Figure 10:
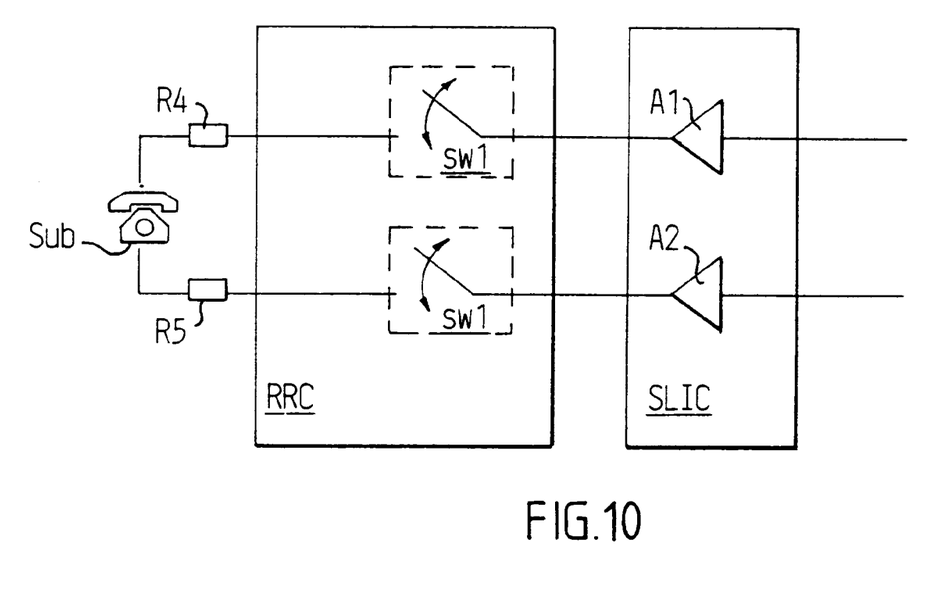
FIG. 10 shows the use of two bidirectional switches in the signal loop between a subscriber and a line circuit in a telephone network.

FIG. 10 is a simplified view of a telecommunications application in which the switch according to the invention will be useful. A first sw1 and a second sw2 switch according to the invention, located in a relay replacement circuit RRC, are used to open and close an incoming and an outgoing subscriber line, respectively, to a subscriber Sub. The subscriber lines are received from the network through a Subscriber Line Interface Circuit SLIC to the relay replacement circuit RRC. The Subscriber Line Interface Circuit SLIC comprises a first A1 and a second A2 amplifier, one for each subscriber line.

The resistance of the incoming and outgoing subscriber lines in this application, including both the switches sw1, sw2 and the amplifiers A1, A2, resistors R4 and R5, and other components that have been left out for clarity, should be kept as low as possible to reduce the noise. Therefore, the switches should be tuned not only with respect to each other, but with respect to the total conductance of the subscriber lines. If amplifiers according to the invention, like the amplifier shown in FIG. 7, are used, the amplifiers may also be used for controlling the conductance of the subscriber lines. It is suitable in such applications to use transistors having a breakdown voltage above ±30V.

Preferably, the two switches sw1 and sw2 should be implemented on the same chip, to make it possible to adjust them accurately to each other.

What is claimed is:

1. An electronic circuit comprising
   a first electronic component having a nominal conductance with a specific inaccuracy,
   at least one supplementary field effect transistor connected in parallel with the first electronic component, and
   means for adjusting an error in the nominal conductance of the electronic circuit.

2. An electronic circuit according to claim 1, wherein the first electronic component is a field effect transistor.

3. An electronic circuit according to claim 2, wherein the supplementary field effect transistors are of the same kind as the first field effect transistor.

4. An electronic circuit according to claim 1, wherein the first electronic component conducts current bidirectionally.

5. An electronic circuit according to claim 1, wherein the first electronic component is a resistor.

6. An electronic circuit according to claim 1, wherein the first electronic component and each supplementary field effect transistor are designed to handle high voltages.

7. An electronic circuit according to claim 1, wherein the sources of all field effect transistors are connected to a common source, the drains of all field effect transistors are connected to a common drain, and the means for adjusting includes a control unit that controls the gate voltage of each field effect transistor individually.

8. An electronic circuit according to claim 2, wherein
   the nominal conductance of the first additional field effect transistor is substantially equal to the inaccuracy of the conductance of the first electronic component;
   the nominal conductance of each following additional field effect transistor is substantially reduced by half compared to the nominal conductance of the previous additional field effect transistor; and
   the control unit connects the gate of each field effect transistor either to a common gate or to the common source.

9. An electronic circuit according to claim 2, wherein the electronic circuit is serially connected with at least one external component,
   each external component having a nominal conductance with a given inaccuracy,
   the nominal conductance of the first additional field effect transistor being substantially equal to the sum of the inaccuracies of the conductances of the first electronic component and at least one of the external components,
   the nominal conductance of each following additional field effect transistor being substantially reduced by half compared to the nominal conductance of the previous additional field effect transistor; and
   the control unit connecting the gate of each additional field effect transistor to a common gate or to the common source.

10. An electronic switch comprising a first and a second electronic component, each having a nominal conductance with a specific inaccuracy, wherein
    the sources of the two electronic components are interconnected,
    said first electronic component has at least one supplementary field effect transistor connected in parallel to said first electronic component,
    said second electronic component has at least one supplementary field effect transistor connected in parallel to said second electronic component, and
    control means are provided for adjusting an error in the nominal conductance of each supplementary field effect transistor.

11. An electronic switch comprising a first and second electronic component, each having a nominal conductance with a specific inaccuracy, wherein
    the sources of the two electronic components are connected to a common source,
    the drains of the two electronic components are connected to a common drain,
    said first electronic component has at least one supplementary field effect transistor of the same type connected in parallel to said first electronic component,
    said second electronic component has at least one supplementary field effect transistor of the same type connected in parallel to said second electronic component, and
    an error in the nominal conductance of each supplementary field effect transistor is adjustable to minimize the inaccuracy of the nominal conductance of the electronic switch.

12. An electronic switch according to claim 10, wherein the first and second electronic components are field effect transistors.

13. An electronic switch according to claim 12, wherein the supplementary field effect transistors are field effect transistors of the same type as the first and second field effect transistors.

14. An electronic switch according to claim 10, wherein the switch conducts current bidirectionally.

15. An electronic switch according to claim 10, wherein the first and second electronic components and all supplementary field effect transistors are designed to handle voltages of both polarities.

16. An electronic switch according to claim 15, wherein the first and second electronic components and all supplementary field effect transistors are designed to handle high voltage of both negative and positive polarities.

17. An electronic switch according to claim 10, wherein the sources of all field effect transistors are connected to a common source, the drain of the first electronic component and the drain of the supplementary field effect transistor or transistors associated with the first electronic component are connected together to a first common drain, the drain of the second electronic component and the drain of the supplementary field effect transistors or transistors associated with the second electronic component are connected together to a second common drain, and at least one control unit controls the gate voltage of each field effect transistor individually.

18. An electronic switch according to claim 17, wherein
the nominal conductance of the first supplementary field effect transistor associated with the first electronic component is substantially equal to the inaccuracy of the conductance of first electronic component;
the nominal conductance of the first supplementary field effect transistor associated with the second electronic component is substantially equal to the inaccuracy of the conductance of second electronic component;
the nominal conductance of each following additional field effect transistor is substantially reduced by half compared to the nominal conductance of the preceding additional field effect transistor; and
the control unit connects the gate of each field effect transistor to a common gate or to the common source.

19. A method of manufacturing an electronic circuit comprising the steps of
providing a first electronic component,
providing at least one supplementary transistor, each supplementary transistor having a specified nominal conductance, and
controlling an error in the specified nominal conductance of said electronic circuit using electronic adjusting means.

20. A method according to claim 19, further comprising providing a field effect transistor as the first electronic component.

21. A method according to claim 19, further comprising the step of providing a resistor as the first electronic component.

22. A method according to claim 19, further comprising the steps of
providing field effect transistors as the supplementary transistor or transistors,
connecting sources of all field effect transistor to a common source,
connecting the drains of all field effect transistor to a common drain, and
controlling the gate voltage of each field effect transistor individually.

23. A method according to claim 22, further comprising the step of connecting the gate of each field effect transistor to a common gate or to the common source.

24. A method of manufacturing an electronic switch comprising a first and a second electronic component, each having a specified nominal conductance with a specific inaccuracy, comprising the steps of
providing at least one supplementary transistor for each of the first and the second electronic components, each supplementary transistor having a specified nominal conductance; and
adjusting an error in the specified nominal conductance of the switch using electronic adjusting means.

25. A method according to claim 24, further comprising the steps of
providing field effect transistors as the supplementary transistor or transistors,
connecting sources of all field effect transistors to a common source,
connecting the drains of all field effect transistors associated with the first electronic component together to form a first common drain,
connecting the drains of the second electronic component and the supplementary field effect transistors associated with the second electronic component together to form a second common drain, and
controlling the gate voltage of each field effect transistor individually.

26. A method according to claim 25, further comprising the step of connecting the gate of each field effect transistor to a common gate or to the common source.

27. A method according to claim 24, further comprising the step of controlling the conductance of the switch depending on a desired conductance of the switch.

28. A method according to claim 24, further comprising the step of controlling the conductance of the switch depending on a desired conductance of the switch and at least one other component serially connected with the switch.

29. An electronic circuit according to claim 1, wherein the error is adjusted by controlling the gate voltage of each supplementary field effect transistor.

30. An electronic switch according to claim 10, wherein the error is adjusted by controlling the gate voltage of each supplementary field effect transistor.

31. An electronic switch according to claim 11, wherein the error is adjusted by controlling the gate voltage of each supplementary field effect transistor.

32. A method according to claim 19, wherein the error is adjusted by controlling the gate voltage of each supplementary field effect transistor.

33. A method according to claim 24, wherein the error is adjusted by controlling the gate voltage of each supplementary field effect transistor.

* * * * *